United States Patent [19]

Gesche et al.

[11] Patent Number: 5,146,137
[45] Date of Patent: Sep. 8, 1992

[54] DEVICE FOR THE GENERATION OF A PLASMA

[75] Inventors: Roland Gesche, Seligenstadt; Karl-Heinz Kretschmer, Langen, both of Fed. Rep. of Germany

[73] Assignee: Leybold Aktiengesellschaft, Hanau, Fed. Rep. of Germany

[21] Appl. No.: 501,094

[22] Filed: Mar. 29, 1990

[30] Foreign Application Priority Data

Dec. 23, 1989 [DE] Fed. Rep. of Germany ....... 3942964

[51] Int. Cl.$^5$ .............................................. H05H 1/46
[52] U.S. Cl. ................................. 315/111.21; 315/39; 315/111.51; 315/248; 313/231.31; 313/307
[58] Field of Search ....................... 315/111.21, 111.41, 315/111.51, 39, 248; 313/231.31, 307, 607; 343/844

[56] References Cited

U.S. PATENT DOCUMENTS

| | | | |
|---|---|---|---|
| 3,283,205 | 11/1966 | De Bolt | 315/111.41 |
| 3,614,525 | 10/1971 | Uleski | 315/111.41 X |
| 4,160,978 | 7/1979 | DuHamel | 343/742 |
| 4,691,662 | 9/1987 | Roppel et al. | 118/50.1 |
| 4,792,732 | 12/1988 | O'Louglin | 315/334 |

FOREIGN PATENT DOCUMENTS

| | | |
|---|---|---|
| 0043454 | 11/1985 | European Pat. Off. |
| 3708716A1 | 9/1988 | Fed. Rep. of Germany |
| 1433898 | 2/1966 | France |
| WO86/06923 | 11/1986 | PCT Int'l Appl. |

OTHER PUBLICATIONS

J. L. Vossen, "Glow Discharge Phenomena in Plasma Etching and Plasma Deposition", J. Electrochem. Soc.: Solid-State and Technology (Feb. 1979), pp. 319, 320.
Mitsuo Kawamura et al., "A Capacitively Coupled RF-Excited CW-HCN Laser", IEEE Journal of Quantum Electronics, vol. QE-21, No. 11 (Nov. 1965), pp. 1833-1837.
R. W. Boswell, "Very Efficient Plasma Generation by Whistler Waves Near the Lower Hybrid Frequency" Plasma Physics and Controlled Fusion, vol. 26, No. 10, pp. 1147-1162, 1984.
G. N. Harding et al, "A Study of Helicon Waves in Indium", Proc. Phys. Soc., 1965, vol. 85.
R. W. Boswell et al, "Fast Etching of Silicon in a Plasma Reactor with Ripe Source" Le Vide, Les Couches Minces, Supplement au No. 246, Mar., Apr. 1989, pp. 160-162.
Oechsner, H., "Electron Cyclotron Wave Resonances and Power Absorption Effects in Electrodeless Low Pressure H.F. Plasmas with a Superimposed Static Magnetic Field," Plasma Physics, vol. 16, pp. 835-844 (1974).
Uesugi, T. et al., "A tandem radio-frequency plasma torch," J. Appl. Phys., 64(8), 15 Oct. 1988, pp. 3874-3878.

Primary Examiner—Eugene R. LaRoche
Assistant Examiner—Do Hyun Yoo
Attorney, Agent, or Firm—Lowe, Price, LeBlanc & Becker

[57] ABSTRACT

The invention relates to a device for the generation of a plasma by means of circularly polarized high frequency waves. These high frequency waves are generated by means of voltages having a phase rotation of 90°.

17 Claims, 5 Drawing Sheets

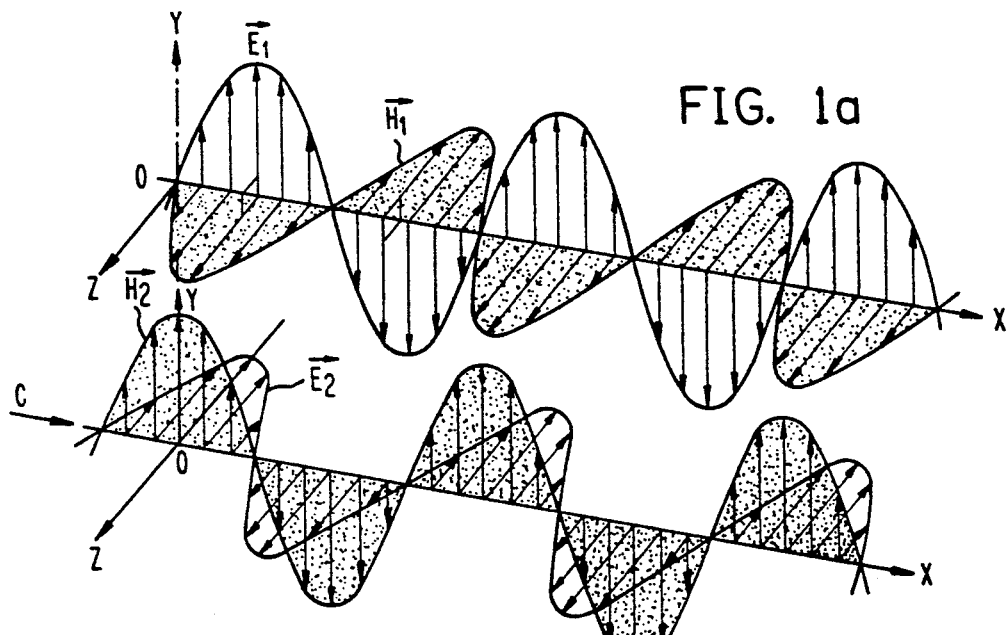
FIG. 1a
FIG. 1b
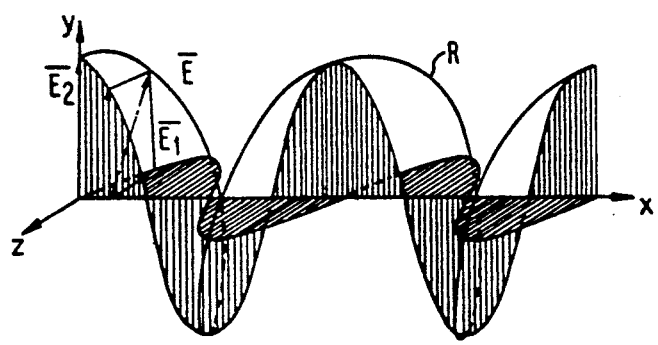
FIG. 2A
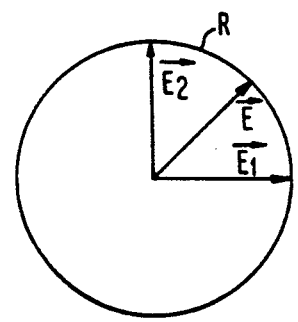
FIG. 2B

DEVICE FOR THE GENERATION OF A PLASMA

TECHNICAL FIELD OF THE INVENTION

The invention relates to a device for the generation of a plasma by means of circularly polarized high frequency waves.

BACKGROUND ART

In numerous fields of technology it is required to vapor-deposit very thin layers of material on carriers to obtain given properties. Examples are interference filters and compact-disc plates. In order to be able to vapor-deposit from the gas phase, gas plasmas must previously be generated, i.e. gases with positive and negative charges as well as neutral particles.

For the production of such plasmas numerous methods are known. A currently widely used method consists in generating an electron cyclotron resonance with the aid of microwaves and static magnetic fields whereby a strong ionization of gases becomes possible. Such microwaves must be fed in with hollow waveguides or similar waveguides since they comprise a frequency range of 300 MHz to 300 GHz or a wavelength range of 1 m to 1 mm. In this range electromagnetic waves behave quasi-optically.

However, plasma excitations are also known in which electromagnetic waves in the UHF range or in the range below 100 MHz are used (U.S. Pat. No. 4,691,662; Oechsner, Plasma Physics, Vol. 16, 1974, pp. 835 to 844; Boswell, Plasma Physics and Controlled Fusion, Vol. 26, No. 10, 1984, pp. 1147 to 1162). If these waves impinge on magnetic fields they propagate parallel to them. In geophysics these waves are known as whistler waves. They originate from lightning strokes and run along the magnetic field lines through space. In the region in which these field lines reach the earth surface a whistling sound is heard in a loudspeaker which goes from high to low sounds. In solid state physics the whistler waves are also called helicon waves (Harding and Thonemann, Study of helicon waves in indium, Proc. Phys. Soc. 1965, Vol. 85, pp. 317 to 328).

To generate whistler or helicon waves in the laboratory circularly polarized waves must first be generated, because the whistler and helicon waves are circularly polarized waves. In this connection it is known for example (Boswell, op.cit., FIG. 4; Boswell, Perry, and Emami, Le Vide, Les Couches Minces, Supplément au No. 246, March/April 1989, FIG. 1) to place an 8.8 MHz oscillation from an oscillator and an amplifier onto a coaxial cable which via two variable high voltage capacitors in a pi-network is adapted to an antenna. Of disadvantage herein is the fact that the special geometry of the antenna makes a matching in terms of power of the waves to the plasma difficult and that the ignition behaviour is problematic.

A microwave plasma generator is also known which includes mutually perpendicular electrodes arrayed around a container (U.S. Pat. No. 4,792,732). In this design a first pair of electrodes is connected through a 90° phase shifter to a voltage supply, and a second pair of electrodes is connected directly to this supply. The electrodes generate a circularly polarized field in the container. The energy is supplied longitudinally through the entire chamber. Only cross-sectional dependence is considered in the applied fields, and homogeneity is assumed in the longitudinal direction of the container. Helicon waves cannot be excited by this device because such excitation must be significantly shorter than the wavelength. Because the known plasma generator operates with microwaves of very short wavelengths, this condition is not met.

In the case of other known arrangements with which circularly polarized waves can be generated due to the antenna geometry it is not possible to carry out a matching in terms of power in a simple manner (U.S. Pat. No. 4,160,978).

OBJECTS AND SUMMARY OF THE INVENTION

Broadly, the object of the invention is to generate plasmas with a high degree of efficiency.

Another, more specific, object of the invention is to create an apparatus generating Whistler or Helicon waves with possible wave-match to different impedances.

The invention, in a first aspect, is an apparatus for generating a plasma inside a container using circularly polarized waves by coupling electromagnetic energy into the plasma through the container wall from the outside. The inventive apparatus comprises four pairs of electrodes. A first pair of the electrodes is connected to a first voltage. A second pair of the electrodes is connected to a second voltage. The first voltage is 90° phase shifted relative to the second voltage. The first and second pairs of electrodes are mounted on a first region of the container. The third pair of the electrodes and the fourth pair of the electrodes are then mounted on a second region of the container a distance from the first region of the container. The third and fourth pair of electrodes are connected to phase shifted voltages, in a manner similar to the first and second pair of electrodes.

In an alternate aspect, the invention is an apparatus for generating a plasma inside a container using circularly polarized waves by coupling electromagnetic energy into the plasma through the container wall from the outside. The inventive apparatus comprises four coils. A first coil is connected to a first voltage. A second coil is connected to a second voltage. The first voltage is 90° phase shifted relative to the second voltage. The third and fourth coil are connected to phase shifted voltages, in a manner similar to the first and second coil.

In yet a third form, the invention is an apparatus for generating a plasma inside a container using circularly polarized waves by coupling electromagnetic energy into the plasma through the container wall from the outside. The inventive apparatus comprises four pairs of coils. A first pair of the coils is connected to a first voltage. A second pair of the coils is connected to a second voltage. The first voltage is 90° phase shifted relative to the second voltage. The first and second pairs of coils are mounted on a first region of the container. The third pair of the coils and the fourth pair of the coils are then mounted on a second region of the container a distance from the first region of the container. The third and fourth pair of coils are connected to phase shifted voltages, in a manner similar to the first and second pairs of coils.

The advantage offered by the invention is that Helicon waves can be generated, thus producing highly efficient plasmas. Since the wavelength at the operational high frequencies is in the range of a few centimeters, excitation may be much shorter than the wavelength. When coupling the wave into the container at at least two sites, a wavelength may be imprinted at corresponding phase length and thereby the plasma density can be controlled. Plasma density depends on wavelength in Helicon waves. Another advantage of the invention is that by displacing the coupling means or by electrically changing the phase position, the wavelength becomes variable, even during operation.

Additional objects, advantages and novel features of the invention will be set forth in part in the description which follows, and in part in will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

FIG. 1a a first linearly polarized wave;
FIG. 1b a second linearly polarized wave;
FIGS. 2A and 2B a circularly polarized wave combined of two linearly polarized waves.

DETAILED DESCRIPTION OF THE PREFERRED EMBODIMENTS

In FIG. 1a a plane linearly polarized electromagnetic wave is represented which propagates along the X-axis, i.e. toward the right. This wave consists of an electric ac field $\vec{E}_1$ which points in the Y-direction as well as of a magnetic ac field $\vec{H}_1$ which points in the Z-direction. The wave is called plane because $\vec{E}_1$ and $\vec{H}_1$ are independent of y and z, thus in the planes x=constant do not change spatially. It is described as linearly polarized because the peaks of the field vectors move at a fixed place in time on a straight line.

FIG. 1b shows a similar wave with the fields $\vec{E}_2$ and $\vec{H}_2$ once again, however phase-displaced by 90 degrees and rotated about 90° in the Y-Z plane.

If the two waves according to FIG. 1a and FIG. 1b are superimposed and the electric fields are considered, the representation of FIG. 2 is obtained, wherein however the direction of rotation of the total field is different. It can be seen herein that the field vectors $E_2$ and $E_1$ are added to form a total field E. Because of the 90° phase shift and the 90° rotation in the Y-Z plane the resultant R describes a spiral. This spiral is in FIG. 2 right-rotating while the addition of FIGS. 1a and 1b leads to a left-rotating spiral. In the view from the right side of the X-axis onto the origin of FIG. 2 hence a vector representation results as it is shown on the right side of FIG. 2.

Figure 3:
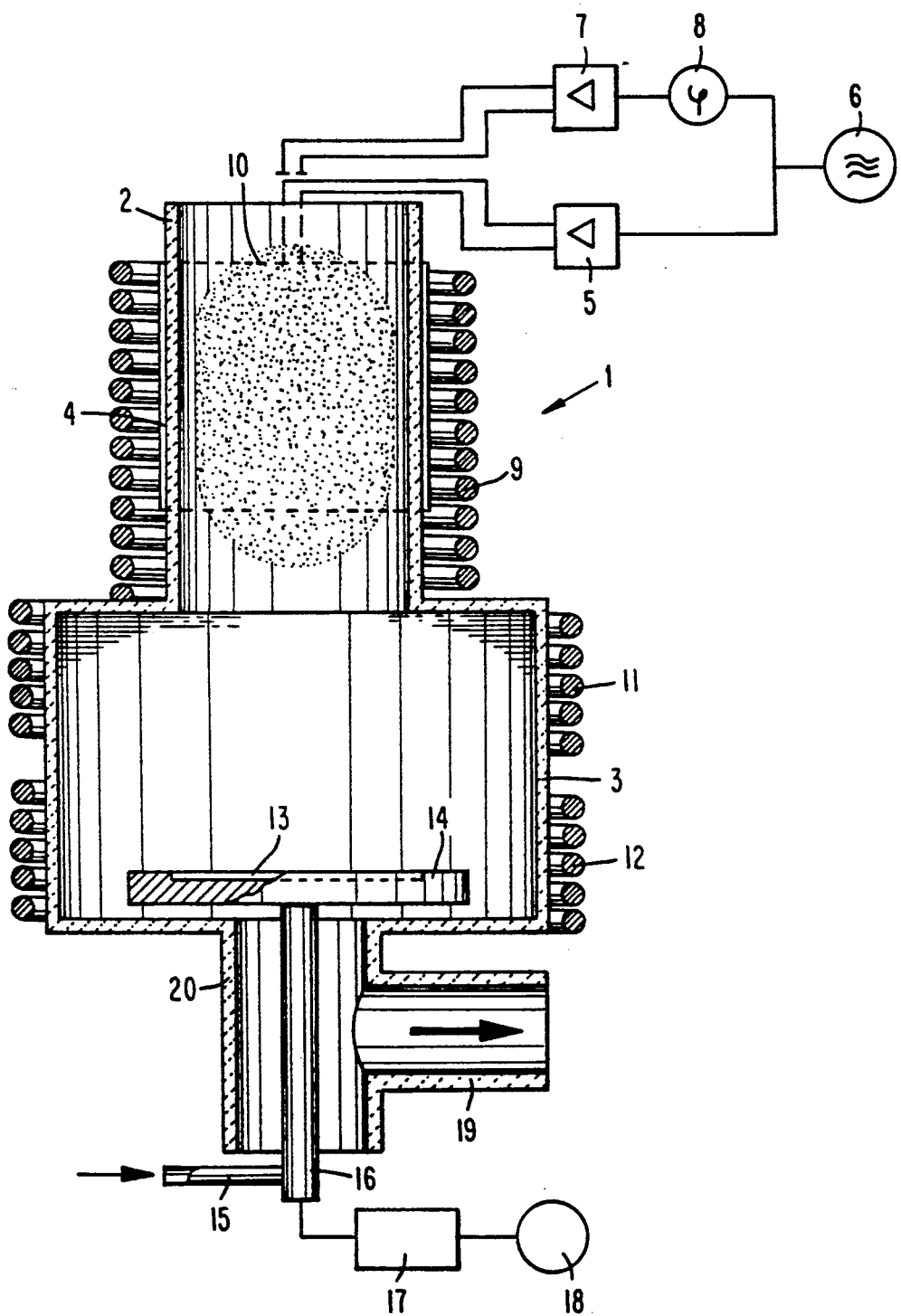
FIG. 3 a plasma chamber with feed of HF energy by means of circularly polarized waves.

In FIG. 3 a plasma chamber 1 is shown containing an upper cylinder 2 and a lower cylinder 3. Both cylinders 2,3 are comprised for example of quartz and are formed unitarily. In the upper cylinder 2 surrounded by two frame antennas, of which only the antenna 4 can be seen, a plasma is formed. The one frame antenna is herein connected to an amplifier 7 while the other frame antenna is connected to an amplifier 5. The amplifier 5 is connected directly with a 13.56 MHz oscillator 6. In contrast the amplifier 7 is connected via a phase shifter 8 to this oscillator 6. With the aid of a solenoid coil 9 in the cylinder 2 a static center field is generated which effects the development of a whistler wave. The high frequency waves emanating from the frame antennas are thus coupled through the magnetic field in the plasma 10 in the whistler or helicon state whereby the transfer of energy into the center of the plasma is ensured.

The advantage of whistler or helicon waves consists in that they enter into resonance with the orbits of the charged particles of plasma 10 in the magnetic field. Through the magnetic field a pinching of plasma 10 is also brought about which, in turn, causes an increase of the density of the plasma. The plasma 10 now diffuses from cylinder 2 into cylinder 3 and is there guided through further solenoid coils 11 and 12. A substrate 13 disposed on a substrate table 14 is in this manner for example etched by the plasma. The substrate table 14 is cooled by a water cooling system 15, 16. To this water cooling means 15, 16 is connected via a matching circuit 17 a high frequency 18. With the aid of a (not shown) vacuum pump the residual plasma which could not be used for etching the substrate 13 is drawn off via a port 19 in the lower region 20 of the plasma chamber 1.

Figure 4:
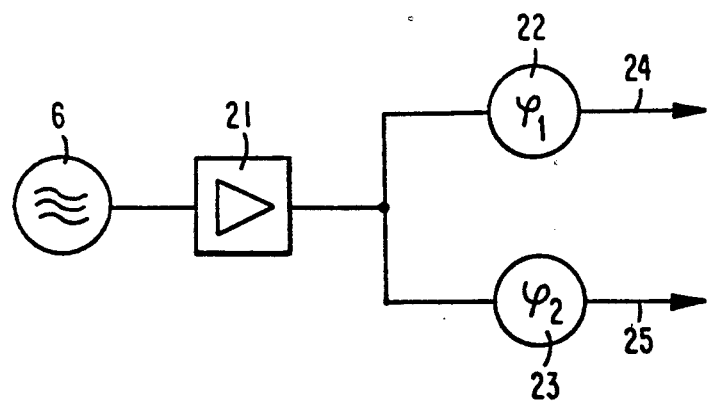
FIG. 4 a circuit with phase shifters for the generation of a circularly polarized wave.

In FIG. 4 a variant of the circuit configuration shown in FIG. 3 for the generation of a circularly polarized wave is shown. The 13.56 MHz oscillator 6 is herein connected via an amplifier 21 with a first phase shifter 22 as well as also with a second phase shifter 23. The outputs 24, 25 of the two phase shifters 22, 23 are connected with the input terminals of the antenna 4 shown in FIG. 3. The configuration of FIG. 4 consequently has thus two phase shifters 22, 23 and one amplifier 21, while the configuration of FIG. 3 comprises one phase shifter 8 and two amplifiers 5, 7.

The phase shifters 8 or 22, 23 respectively function in both cases to generate two HF voltages phase-shifted by 90° and to feed via an antenna 4.

Figure 5:
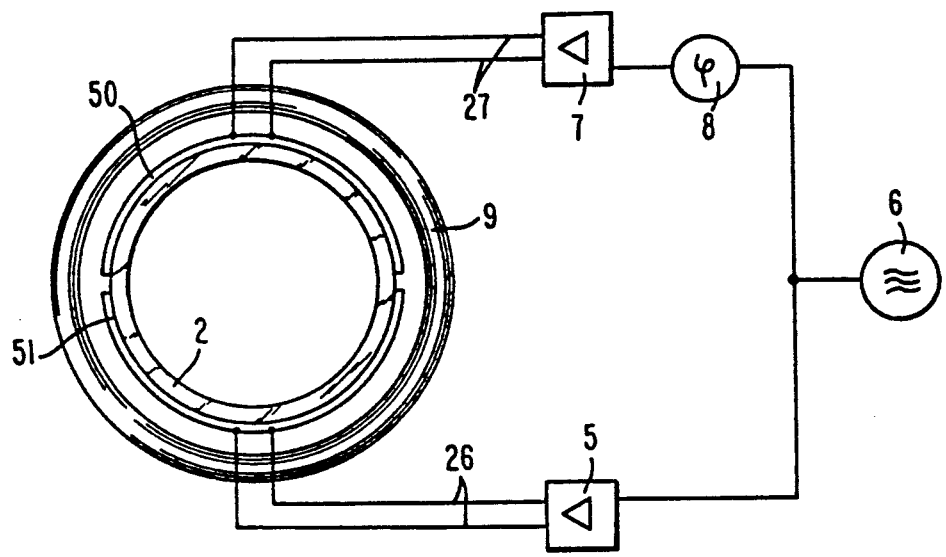
FIG. 5 a view from above onto the plasma chamber according to FIG. 3.

FIG. 5 shows a view from above onto the upper cylinder 2 of the plasma chamber. Two frame antennas 50, 51 can be seen of which the frame antenna 51 corresponds to antenna 4 in FIG. 3. Each of these antennas 50, 51 is connected via electric lines 27, 26 to an amplifier 7, 5.

Figure 6:
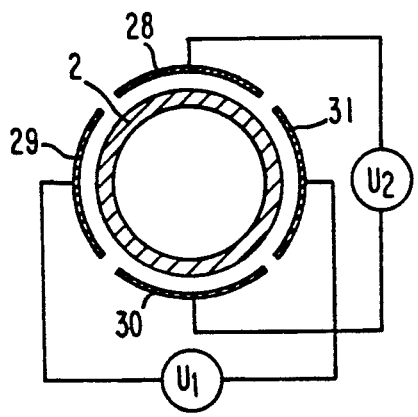
FIG. 6 a configuration for the capacitive coupling-in of a circularly polarized wave.

In FIG. 6 the upper cylinder 2 of the plasma chamber 1 is shown surrounded by four electrodes 28 to 31. Herein a first voltage $U_1$ is applied at the opposing electrodes 29, 31 and a second voltage $U_2$ at the opposing electrodes 28, 30. The two voltages $U_1$, $U_2$ are phase-shifted by 90° so that a circularly polarized wave develops.

Figure 7:
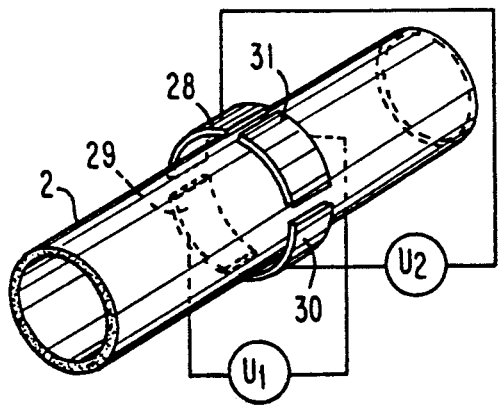
FIG. 7 a perspective representation of the configuration according to FIG. 6.

FIG. 7 once again shows the configuration of FIG. 6 in perspective representation. The four electrodes 28 to 31 are offset by approximately 90° wherein to in each instance two opposing electrodes is applied in each instance one of the voltages $U_1$, $U_2$ phase-shifted by approximately 90°.

Figure 8:
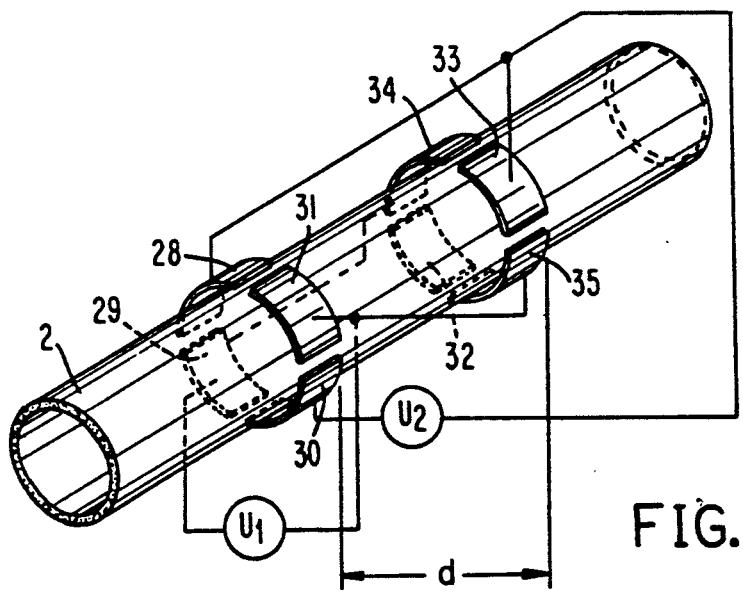
FIG. 8 a configuration according to FIG. 7 however with capacitive feed-in which have a distance d from each other.

In FIG. 8 several electrode configurations (28 to 31, 32 to 35) are shown disposed at a distance to each other and fed offset by one phase difference. It would also be possible to rotate the configuration 28 to 31 on the cylinder 2 relative to the configuration 32 to 35. The distance d between the two configurations is in an advantageous implementation approximately one-fourth of the effective wavelength.

Figure 9:
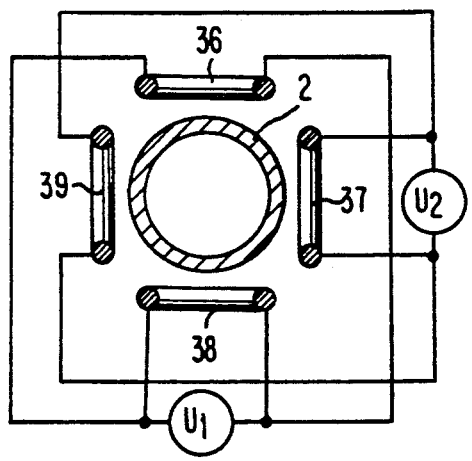
FIG. 9 a configuration with inductive feed-in of the electromagnetic energy into the plasma.

In FIG. 9 an inductive coupling of the electromagnetic energy into the plasma is shown. To this end four coils 36 to 39 are provided which are disposed on the outside of the cylinder or tube 2 offset by in each instance approximately 90°. In each instance to the two opposing coils 37, 39 or 36, 38 is applied a voltage $U_2$ or $U_1$ respectively wherein the one voltage $U_1$ is phase-shifted by 90° with respect to the other voltage $U_2$.

Figure 10:
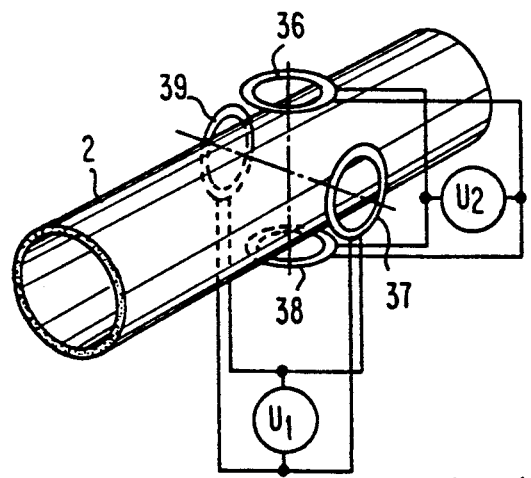
FIG. 10 a perspective representation of the configuration according to FIG. 9.

In FIG. 10 the configuration of FIG. 9 is shown in perspective. All coils 36 to 39 are disposed on the same circumference of cylinder 2. It is however also possible to offset the coils 37, 39 with respect to coils 36, 38 along the axis of cylinder 2. In addition, they can be rotated about this axis relative to each other.

Figure 11:
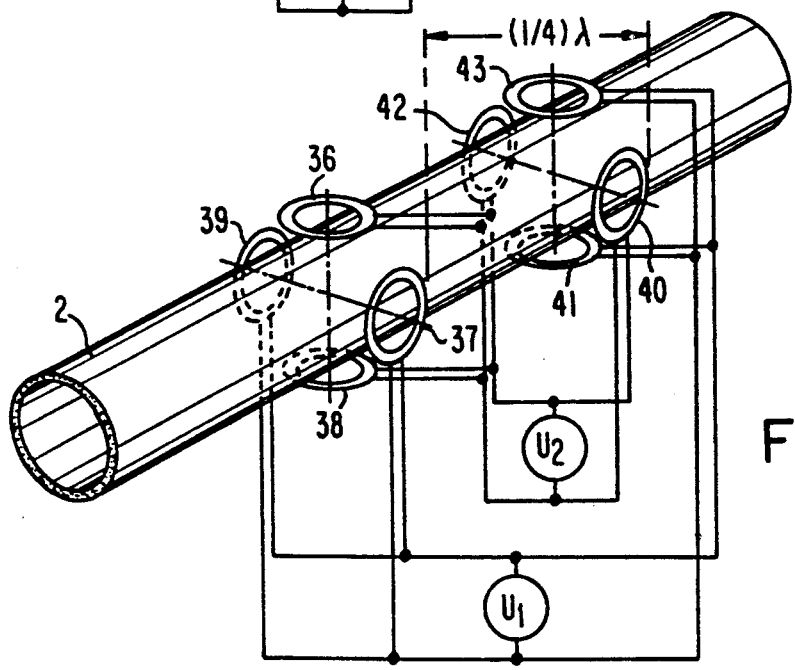
FIG. 11 two configurations according to FIG. 10 which are offset in $\lambda/4$ relative to each other.

FIG. 11 shows two coil configurations 36 to 39, 40 to 43 which are disposed at a distance of approximately one-fourth of the effective wavelength on the circumference of cylinder 2. The fields generated by these configurations 36 to 39 or 40 to 43 respectively have a phase angle of approximately 90° with respect to each other.

In the above embodiments, for achieving a phase rotation of approximately 90°, a line is used whose length corresponds approximately to one-fourth of the wavelength of the high frequency voltages $U_1$ and $U_2$.

We claim:

1. An apparatus for generating a plasma inside a first container using circularly polarized high frequency waves by coupling electromagnetic energy into the plasma through the container wall from the outside, said apparatus comprising:
   a first pair of field generating means connected to a first voltage;
   a second pair of field generating means connected to a second voltage, wherein the first voltage is 90° phase shifted relative to the second voltage, said first and second pairs of field generating means being mounted on a first region of the container; and
   a third pair of field generating means and a fourth pair of field generating means mounted on a second region of the container a predetermined distance along the longitudinal axis of the container from the first region of the container, said third and fourth pairs of field generating means being connected to sources of voltage phase shifted with respect to each other.

2. An apparatus as defined in claim 1 further comprising:
   a high frequency voltage source in the form of an oscillator;
   a first amplifier amplifying the output signal of the oscillator to produce the second voltage such that the amplified signal from the first amplifier is applied once to said plasma without phase shift;
   a second amplifier amplifying the output signal of the oscillator; and
   a phase shifter shifting the phase of the signal input to the second amplifier to produce the first voltage such that the amplified signal from the second amplifier is applied once to said plasma with phase shift.

3. An apparatus as defined in claim 1 further comprising:
   a high frequency voltage source in the form of an oscillator;
   an amplifier amplifying the output signal of the oscillator;
   a first phase shifter shifting the phase of the signal from the amplifier to produce the first voltage; and
   a second phase shifter shifting the phase of the signal from the amplifier to produce the second voltage such that the amplified signal from the amplifier is applied once to said plasma with phase shift.

4. An apparatus as defined in claim 1, wherein each of said pairs of field generating means comprises a pair of electrodes.

5. An apparatus as defined in claim 4 wherein the first and second pairs of electrodes are offset about the axis of the container relative to the third and fourth pairs of electrodes.

6. An apparatus as defined in claim 1, wherein each of said field generating means comprises a pair of coils.

7. An apparatus as defined in claim 6 wherein:
   said first and second pairs of coils are each mounted substantially 90° apart from each other around the container, the waves generated thereby being offset from each other by 90°; and
   the coils of said third and fourth pairs of coils are each mounted substantially 90° apart from each other around the container, the waves generated thereby being offset from each other by 90°.

8. An apparatus as defined in claim 4, wherein a static or low-frequency magnetic field is applied to the plasma in addition to the high frequency waves, whereby helicon waves are generated.

9. An apparatus as defined in claim 8, wherein the static or low-frequency magnetic field is generated by a coil surrounding the container.

10. An apparatus as defined in claim 1, wherein a second container joins said first container holding the plasma and is integral with the first container, and a coil is mounted around the second container.

11. An apparatus as defined in claim 4, characterized in that the predetermined distance is adjustable by mechanically displacing the electrodes resulting in an adjustment of the wavelength in the plasma.

12. An apparatus as defined in claim 1 wherein wavelength in the plasma is adjustable by electrically changing the phase shift of the first and second.

13. An apparatus for generating a plasma inside a container using circularly polarized waves by coupling electromagnetic energy into the plasma through the container wall from the outside, said apparatus comprising:
   a first pair of field generating means connected to a first voltage;
   a second pair of field generating means connected to a second voltage, wherein the first voltage is 90° phase shifted relative to the second voltage; and
   a third pair of and a fourth pair of field generating means longitudinally separated from said first and second pairs of field generating means along said container, said third and fourth pairs of field generating means being connected to sources of voltage phase shifted with respect to each other.

14. An apparatus as defined in claim 13, wherein each of said pairs of field generating means comprises a pair of coils, and wherein said pairs of coils are mounted around the container, and said first and third pairs of coils are both connected to the first voltage source and said second and fourth pairs of coils are both connected to the second voltage.

15. An apparatus as defined in claim 14, characterized in that the first pair of coils fed by the first voltage are mounted along a first axis and the third pair of coils fed by the first voltage are mounted along a second axis, tho first axis being perpendicular to the second axis.

16. An apparatus as defined in claim 13, wherein each of said pairs of field generating means comprises a pair of electrodes.

17. An apparatus as defined in claim 13, wherein each of said pairs of field generating means comprises a pair of coils.

* * * * *